United States Patent [19]

Yamanaka et al.

[11] Patent Number: 5,331,397
[45] Date of Patent: Jul. 19, 1994

[54] INNER LEAD BONDING INSPECTING METHOD AND INSPECTION APPARATUS THEREFOR

[75] Inventors: Kazuyuki Yamanaka; Mitsusada Shibasaka, both of Fujisawa, Japan

[73] Assignee: Kabushiki Kaisha Toshiba, Kawasaki, Japan

[21] Appl. No.: 973,543

[22] Filed: Nov. 9, 1992

Related U.S. Application Data

[63] Continuation of Ser. No. 617,798, Nov. 26, 1990, abandoned.

[30] Foreign Application Priority Data

Nov. 24, 1989 [JP] Japan .................. 1-306038

[51] Int. Cl.⁵ .................. G01N 21/89; G01B 11/24
[52] U.S. Cl. .................. 356/237; 356/394; 250/561; 250/562; 348/126
[58] Field of Search ........... 356/237, 238, 371, 376, 356/445, 448, 429, 430, 394, 398; 250/561, 562, 572; 228/103, 105; 358/101, 106, 107

[56] References Cited

U.S. PATENT DOCUMENTS

| | | |
|---|---|---|
| 3,877,814 | 4/1975 | Hess et al. ........... 356/371 |
| 4,215,939 | 8/1980 | Miller et al. ........... 356/371 |
| 4,242,702 | 12/1980 | Kuni et al. ........... 356/394 |
| 4,543,659 | 9/1985 | Ozaki ........... 356/237 |
| 4,583,861 | 4/1986 | Yamaji et al. ........... 356/448 |
| 4,626,101 | 12/1986 | Ogawa et al. ........... 356/237 |
| 4,677,473 | 6/1987 | Okamoto et al. ........... 228/105 |
| 4,874,956 | 10/1989 | Kato et al. ........... 250/560 |
| 4,876,455 | 10/1989 | Sanderson et al. ........... 250/560 |
| 5,030,008 | 7/1991 | Scott et al. ........... 356/394 |
| 5,166,753 | 11/1992 | Tokura ........... 356/394 |

OTHER PUBLICATIONS

European Search Report.
Patent Abstracts of Japan, vol. 1, No. 63, 20 Jun. 1977, & JP-A-52 003487 (Nov. 1, 1977).
Patent Abstracts of Japan, vol. 6, No. 52, 7 Apr. 1982, & JP-A-56 164545 (Dec. 17, 1981).
Patent Abstracts of Japan, vol. 10, No. 343, 19 Nov. 1986, & JP-A-61 147542 (May 7, 1986).
Patent Abstracts of Japan, vol. 13, No. 086, 28 Feb. 1989, & JP-A-63-265442 (Jan. 11, 1988).

*Primary Examiner*—Davis L. Willis
*Assistant Examiner*—Hoa Q. Pham
*Attorney, Agent, or Firm*—Foley & Lardner

[57] ABSTRACT

An inner lead bonding inspecting method comprises the steps of: irradiating an illumination light onto the planar surface of a bonding portion between an electrode bump provided on a semiconductor pellet and an inner lead, measuring the quantity of reflected light from the surface, and judging whether the bonding state of the inner lead bonding is good or bad on the basis of the measured result. According to another aspect, an inner lead bonding inspecting apparatus comprises any irradiation device for irradiating a light onto a planar surface of a bonding portion between an electrode bump provided on a semiconductor pellet and an inner lead; a light quantity measurement device for measuring the quantity of reflected light from the inner lead surface, and a judging device for comparing the measured quantity of reflected light with a reference light quantity, to judge the quality of the bonding state.

1 Claim, 3 Drawing Sheets

INNER LEAD BONDING INSPECTING METHOD AND INSPECTION APPARATUS THEREFOR

This application is a continuation of application Ser. No. 07/617,798, filed Nov. 26, 1990, now abandoned.

BACKGROUND OF THE INVENTION

This invention relates to a method of inspecting semi-manufactured articles after the ILB (Inner Lead Bonding) process which is the process for manufacturing TAB (Tape Automated Bonding) products, and an apparatus for inspecting the same, and more particularly to a method and an apparatus used for automated inspection of the bonding state of an inner lead bonding by observation of its appearance.

In accordance with the TAB system, inner leads of a carrier tape are aligned with a plurality of electrode bumps or projected-connection electrodes formed on an IC pellet. Then, the inner lead bonding process for simultaneous connection is carried out. In the prior conventional art, the judgment arts whether or not the bonding or connecting state between bumps and inner leads is good was conducted by a visual human inspection, using a stereoscopic-microscope.

In accordance with this method, a visual inspection operator inspected the inner lead surface in the vicinity of the bonding portion of the inner lead to subjectively judge, relying on the operator's training and experience. If the surface is shining brightly, the bonding state is judged to be acceptable, If not, the bonding state is judged unacceptable".

Since the objective judgment as to whether or not bonding state is good cannot be so conducted. There may be disagreement between operators, or disagreement due to a lapse of time even for the same operator. As a result, the quality varied. Further, in a visual test, there is high possibility that oversight, misperception, etc. may occur. Accordingly, the criteria for judgment may change or an artificial error may occur. On the other hand, although automation of the manufacturing process may be required, conventional subjective testing methods cannot cope with automation.

SUMMARY OF THE INVENTION

An object of this invention is to provide an inner lead bonding inspecting method and inspection apparatus therefor when the bonding state between electrode bumps on a pellet and inner leads is inspected. Indicating whether the bonding state is good or bad as a quantitative numeric value, makes it possible to conduct an objective quality judgment, and to provide numeric criteria for judgment in automated inspections.

According to this invention, there is provided an inner lead bonding inspecting method comprising the steps of: irradiating an illumination light onto the planar surface of a bonding portion between an electrode bump provided on a semiconductor pellet and an inner lead, measuring the quantity of the reflected light from the surface, and judging whether the bonding state of the inner lead bonding is good or bad, on the basis of the measured result.

According to this invention, there is provided an inner lead bonding inspection apparatus comprising: irradiation means for irradiating a light onto a planar surface of a bonding portion between an electrode bump provided on a semiconductor pellet and an inner lead; light quantity measurement means for measuring a quantity of a reflected light from the inner lead surface, and judgment means for comparing the measured quantity of reflected light with a reference light quantity to objectively judge the nature of the bonding state.

In accordance with the inner lead bonding inspecting method of this invention, an approach is employed for judging whether or not the bonding state between electrode bumps on a pellet and inner leads that measure a quantity of specularly reflected light from the inner lead surface at the bonding portion to express it as a quantitative numeric value. Accordingly, objective judgment as to whether or not the bonding state is good can be made, thus contributing to improvement in the quality of inspected products. In addition, numeric criteria for judging can be provided in an automated test.

DESCRIPTION OF THE PREFERRED EMBODIMENT

Initially, the principle of measurement used in this invention will be described.

In the good bonding state of an inner bonding (the state having negligible small junction resistance and a sufficient connecting strength), a film metal (e.g., Sn or Au of plating film) of an inner lead at the bonding portion of the inner lead and in the vicinity therewith is completely melted. The surface of the inner lead at the bonding portion (which may sometimes be referred simply as a bonding portion surface) is smooth. On the contrary, in the bad bonding state, the molten conditions is imperfect, and many fine uneven portions are formed on the surface of the bonding portion, resulting in loss of smoothness. Accordingly, it is possible to detect whether or not the bonding state of the inner lead bonding is good on the basis of smoothness of the bonding portion surface, i.e., brilliance of appearance.

Figure 2:
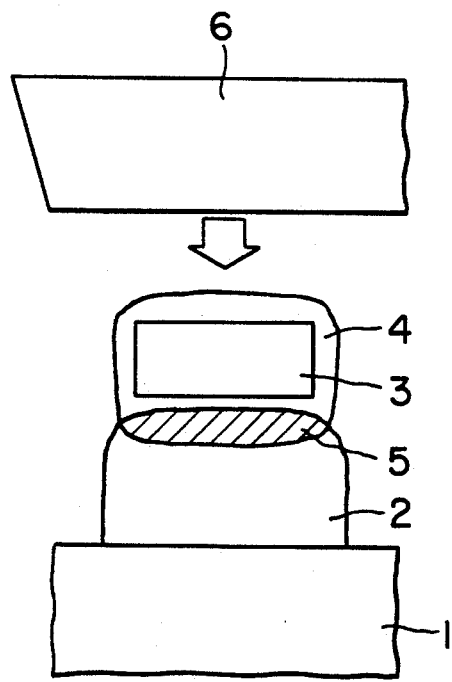
FIGS. 2 and 3 are cross sectional views for explaining good and bad bonding states of the inner lead bonding, respectively.
Figure 3:
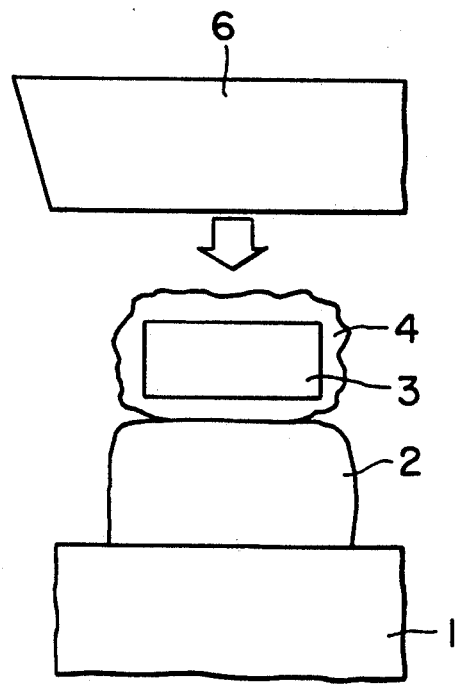

FIGS. 2 and 3 are cross sectional views of the bonding portion for explaining the bonding states. With a good bonding state, as shown in FIG. 2, an eutectic region 5 is produced by eutectic reaction between a surface metal of the electrode bump 2 provided on the semiconductor pellet 1 and a film metal 4 of an inner lead 3. For producing the eutectic reaction, sufficient heat is applied to the bonding portion. In the case of the inner lead bonding, heat is applied from a bonding tool 6, having a planar bottom surface heated to a predetermined temperature, to the bonding portions via the upper side surface of the inner leads. Accordingly, in order to obtain a satisfactory bonding state, i.e., a eutectic reaction, it is required that sufficient heat be applied also to the inner lead surface layer. It can be said that if sufficient heat is applied to the inner lead surface layer, a satisfactory eutectic reaction is provided.

On the contrary, in the bad bonding state shown in FIG. 3, the contact between the bonding tool and the upper side surface of the inner lead is bad, so sufficient heat is not applied to the inner lead surface layer. Accordingly, since the film metal 4 is not completely molten, the surface is not smooth and a satisfactory eutectic reaction cannot be obtained.

From these facts, observation of the molten state of the film metal 4 makes it possible to make a judgment as to whether the eutectic reaction is good or bad, i.e., the bonding state is good or bad.

Explanation has been given in connection with the case of bonding by the eutectic reaction (Au-Sn eutectic alloy) between the surface metal (e.g., Au) of the electrode bump and the film metal (e.g., Sn) of the inner lead. In addition, the case of bonding by thermal compression (Au-Au thermal compression) between the surface metal (e.g., Au) of the electrode bump and the inner lead film metal (e.g., Au) is substantially the same as above. Namely, in the bonding state having good thermal compression, the inner lead surface at the bonding portion is smooth. Accordingly, it is possible to detect the degree of bonding state by the brilliance of appearance on the bonding portion surface.

In the prior art, a method was employed to visually judge "smoothness" of the bonding portion surface as "brilliance". In contrast, the method of this invention measures brilliance of the surface, i.e., irradiate an illumination light an the surface to measure a quantity of specularly reflected light from the surface, to numerically express "smoothness", thus, to detect the degree of the bonding state.

Figure 1:
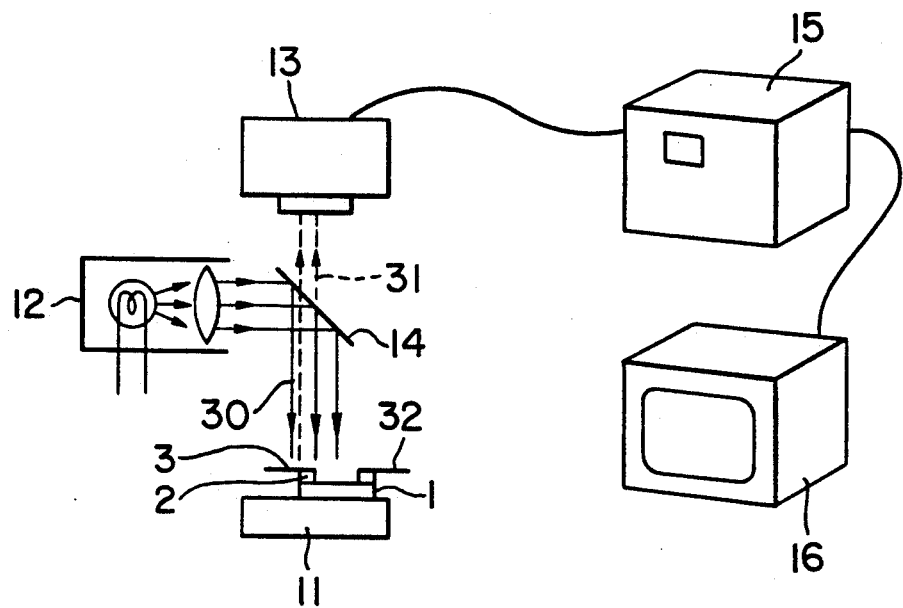
FIG. 1 is a schematic view showing an embodiment of this invention.

FIG. 1 is a block diagram showing a testing apparatus used in an embodiment of an inner lead bonding testing method according to this invention. A semiconductor pellet 1 which has undergone inner lead bonding of an article to be tested is mounted on an X·Y stage 11. This pellet 1 is illuminated from the upper side by an illumination device 12, and is imaged by an image pick-up device or imager 13 (e.g., ITV camera). In this instance, it is required for measuring brilliance of a bonding portion surface 32 of the inner lead 3 on the pellet 1 to pick up a specularly reflected image of the surface by the image pick-up device 13. For this reason, in this embodiment, since a flat bonding head is used to implement bonding to a large number of inner leads at the same time, a half mirror 14 is provided. Illumination light 30 is incident perpendicular to the principal surface of the pellet 1, and the illumination light and light 31 for image-picking up are caused to be coaxial. An illumination light may be irradiated obliquely with respect to the principal surface of the pellet 1. In this case, the reflection direction in which an illumination light is specularly reflected on the pellet 1 and the optical axis of the image pick-up device 13 must be in correspondence with each other.

An image signal from the image pick-up device 13 is inputted to a measurement device 15. At the measurement device, a quantity of specularly reflected light from the inner lead surface at the bonding portion is measured. An image picked up by the image pick-up device 13 is displayed on a monitor 16. On the basis of this image, inner leads to be measured are caused to be in correspondence with measurement positions on the screen. This may be done in accordance with a manual operation by an operator, or an automatic operation by the pattern recognition.

Figure 4:
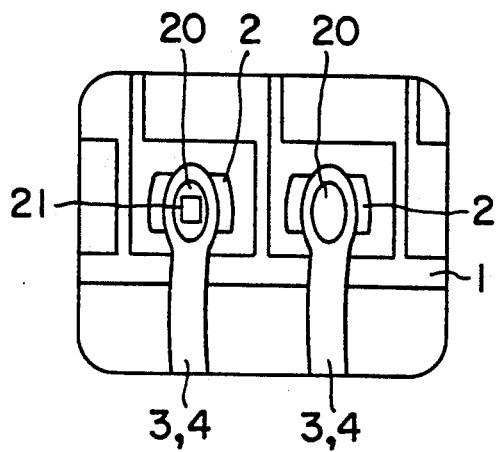
FIGS. 4 and 5 are views for explaining how the inner lead surface of good and bad bonding states in the embodiment of this invention are reflected or imaged, respectively.
Figure 5:
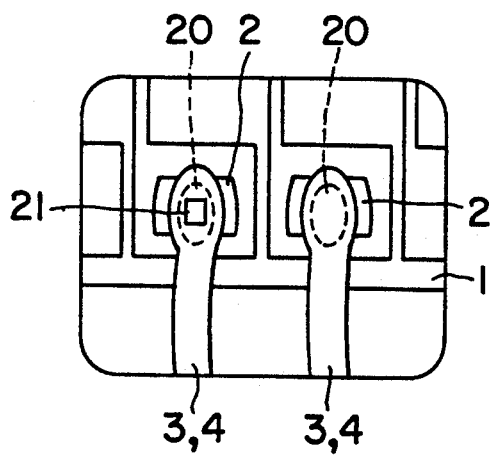

The portion in the vicinity of the inner lead bonding portion is imaged as images shown in FIGS. 4 and 5. FIG. 4 indicates a good bonding state, and FIG. 5 which shows plan views of the bonding portions shown in FIGS. 2 and 3, obtained by the image pick up device 13 of FIG. 1 indicates a bad bonding state. The measurement device 15 measures brightness in a predetermined region 20 encompassed by single dotted lines on the inner lead surface at the bonding portion from the above-mentioned image. To realize this, in FIG. 4 or 5, it is preferable to open a window 21 in the predetermined region 20 to measure brightness only in this portion.

Figure 6:
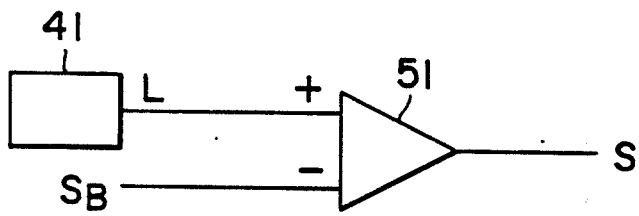
FIGS. 6 and 7 are circuit diagrams showing the configuration of a circuit for making a judgment of the bonding state.

The judgment as to whether the bonding state is good or bad on the basis of brightness may be preferably conducted, as shown in FIG. 6, by comparing a brightness measurement signal $S_B$ with a reference level L outputted from a reference level generator 41 at a comparator 51 to generate a judgment signal S therefrom.

Figure 7:
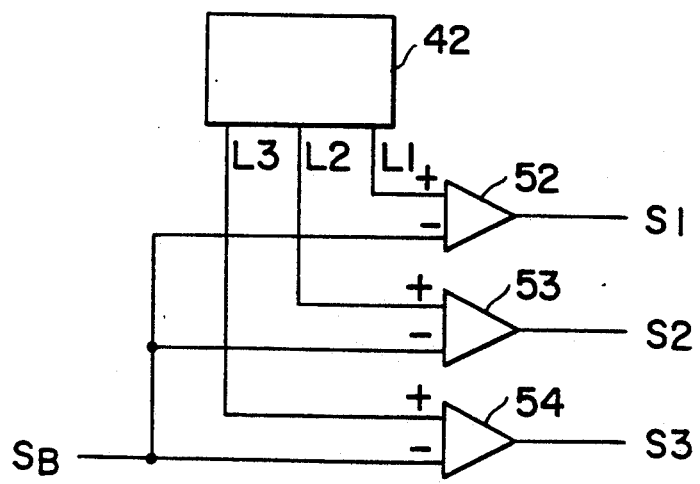

In the case of dividing the judged result into several stages in dependency upon the reflection, to an approach may be employed, as shown in FIG. 7. Different levels $L_1$, $L_2$ and $L_3$ are outputted from a reference level generator 42 to compare these levels with a brightness measurement signal $S_B$ at comparators 52, 53 and 54. Outputs S1, S2 and S3 respectively, are generated therefrom.

The measurement device 15 comprises an image processing unit composed of the above-mentioned reference level generators and comparators, an image input-/output section, an image memory, and a computation section, etc. It and further comprises control signal generator means for controlling the operations of the image pick-up device 13 and the X·Y stage 11, etc.

The test procedure according to this invention will now be described in detail.

In this embodiment, brightness in the predetermined region 20 of an image is expressed as a mean or average value of image signals of respective pixels constituting the region 20. Accordingly, brilliance of the bonding portion surface, i.e., a quantity of specularly reflected light from the surface is represented by the above-mentioned image signal value. Thus, the degree of the bonding state can be grasped or recognized as a quantitative numeric value.

Figure 8:
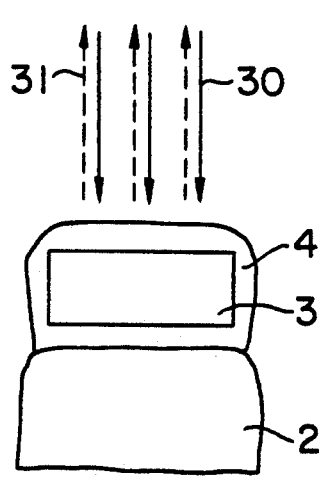
FIGS. 8 and 9 are cross sectional views for explaining reflection of a light on the inner lead surface of good and bad bonding states in the embodiment of this invention, respectively.
Figure 9:
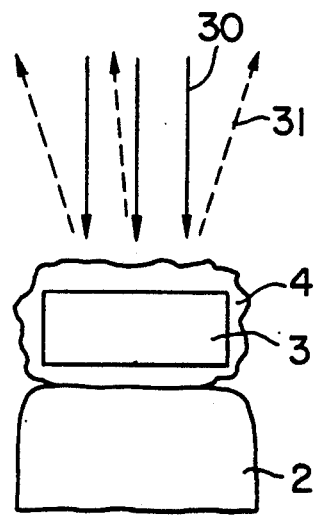

With a good bonding state, since the inner lead surface is smooth as shown in FIG. 8, most of rays of an illumination light 30 are specularly reflected, to be imaged. In contrast, in a bad bonding state, since fine uneven portions exist on the inner lead surface, many components are irregularly reflected, as shown in FIG. 9. This results in a small quantity of rays of light which contribute to image picking up. In FIG. 9, reference numeral 31 denotes a reflected light (broken lines). A quantity of specularly reflected light in the predetermined region 20 on the inner lead surface and brightness in the predetermined region 20 in the pictorial image shown in FIG. 4 or 5 have a correspondence relationship with each other.

In this embodiment, in order to judge of the bonding state is good or bad, a good article limit sample (good articles of the lowest grade) or a bad article limit sample (bad articles of the highest grade) are used in a conventional human inspection. Namely, an approach is employed to measure the image signal value indicating brilliance of the limit sample immediately before the test is started to store it at a reference level generator (41 or 42) in the measurement device 15 as a reference value of brilliance. The judgment as to whether the bonding state of articles to be tested is good or bad is carried out by comparing image signal values of the articles to be tested with the reference value.

It is to be noted that an approach may be employed to express brilliance of the inner lead surface at the bonding portion with a ratio between a quantity of illumination light incident to the surface and a quantity of specularly reflected light from the surface to determine in advance a reference value of this relative brilliance to judge if the bonding state is good or bad.

Although the area of the region on a pellet imaged by the image pick-up device 13 varies in dependency upon the size of the pellet, the number of electrode bumps, the test grade, etc., an approach is ordinarily employed to finely divide the pellet principal surface into a plurality of regions, to test finely divided regions.

Figure 10:
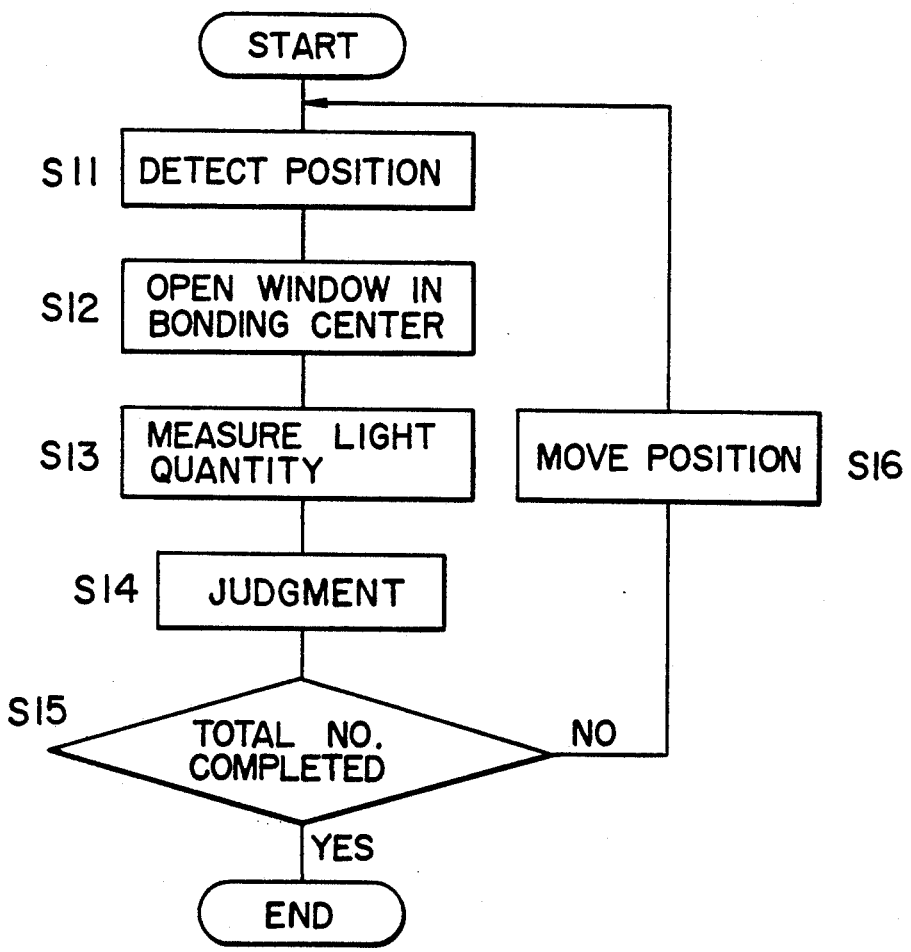
FIG. 10 is a flowchart showing the procedure of a test to which this invention is applied.

The outline of an inner lead bonding testing method in this embodiment will now be described with reference to FIG. 10. Initially, a pellet 10 to be tested is mounted on the X·Y stage 11 to adjust the X·Y stage, etc. to place, at a predetermined position, a region to be imaged of the pellet principal surface (step S11). Then, an illumination light 30 is irradiated from the upward direction perpendicularly onto the region to be imaged to pick up an image of the region to be imaged by the image pick-up device (monochromatic ITV camera) 13. An image signal from the image pick-up device 13 is transmitted to the measurement device 15, and then stored into a density image memory of 8 bits per each pixel via the image input section of the measurement device 15. At this time, an approach may be employed to open a window 21 in the predetermined region 20 (step S12) to measure a light quantity in that region (step S13).

Then, a mean value of brightness of entire pixels within the window, i.e., the degree of the bonding state, is good or bad, is determined. Then, the mean value of brightness and a reference value obtained in advance from the limit sample are compared with each other to judge whether the bonding state is good or bad (step S14). Thus, a desired processing result is outputted to the image output section. When such a judgment is completed in connection with the total number of portions to be measured (step S15), the test is completed. In contrast, when that judgment is not completed, movement of the position (step S16) is carried out to repeatedly execute the processing at the step S11 to that at the step S15.

It is to be noted that the testing method according to this invention is not limited to the above-described embodiment. While a semiconductor pellet of an article to be tested is mounted on the X·Y stage, and then moved in the above-mentioned embodiment, an approach may be employed, for example, to mount an article to be tested on a fixed stage to directly connect the image pick-up device onto the X·Y stage to move it.

In addition, in place of using a window, an approach may be employed to specify coordinates in the predetermined region 20 of the bonding portion surface of the inner lead bonding in the image memory, thus to determine brightness.

What is claimed is:

1. An inner lead bonding inspection method comprising the steps of:
    illuminating with a light a planar surface of an inner lead at a bonding portion between an electrode bump provided on a semiconductor pellet and the inner lead, the illumination from the light being directed normally to the planar surface;
    observing with a video camera the inner lead at the bonding portion;
    positioning the bonding portion at a predetermined position;
    defining a limited area, including a bonding center, on the surface of the inner lead as a window;
    measuring with the video camera the quantity of reflected light from said window, the measured reflected light being that light directed normally to the surface of the bonding portion, and
    judging whether the inner lead bonding is good or bad by comparing the measured quantity of normally reflected light with a plurality of reference levels with respect to quantities of light.

* * * * *